United States Patent [19]

Sano et al.

[11] Patent Number: 5,486,237
[45] Date of Patent: Jan. 23, 1996

[54] POLYSILICON THIN FILM AND METHOD OF PREPARING POLYSILICON THIN FILM AND PHOTOVOLTAIC ELEMENT CONTAINING SAME

[75] Inventors: Keiichi Sano; Yoichiro Aya, both of Moriguchi, Japan

[73] Assignee: Sanyo Electric Co., Ltd., Moriguchi, Japan

[21] Appl. No.: 263,528

[22] Filed: Jun. 22, 1994

[30] Foreign Application Priority Data

Jun. 24, 1993 [JP] Japan ................... 5-153692

[51] Int. Cl.$^6$ ............... H01L 31/04; H01L 31/0392; H01L 31/0368
[52] U.S. Cl. .............. 136/258; 148/33.2; 257/51; 257/64; 257/75; 428/620; 437/4; 437/109; 437/247; 437/967
[58] Field of Search .......... 148/33.2; 428/620; 437/4, 109, 247, 967; 136/258 PC; 257/51, 64, 75

[56] References Cited

U.S. PATENT DOCUMENTS

| | | | |
|---|---|---|---|
| 3,953,876 | 4/1976 | Sirtl et al. ................... | 437/2 |
| 4,434,318 | 2/1984 | Gibbons ................... | 136/258 |
| 4,657,603 | 4/1987 | Kruehler et al. ........... | 437/83 |
| 4,677,250 | 6/1987 | Barnett et al. ............. | 136/258 |
| 5,155,051 | 10/1992 | Noguchi et al. ........... | 437/4 |
| 5,221,365 | 6/1993 | Noguchi et al. ........... | 136/258 |
| 5,336,335 | 8/1994 | Hall et al. ................. | 136/258 |

FOREIGN PATENT DOCUMENTS 4-177880  6/1992  Japan ................. 136/258 PC

Primary Examiner—Aaron Weisstuch
Attorney, Agent, or Firm—W. G. Fasse; W. F. Fasse

[57] ABSTRACT

A polysilicon thin film obtained by using a heat treatment to crystallize an amorphous silicon thin film formed on a substrate has substantially no grain boundaries present in the direction of its thickness, i.e. substantially no grain boundaries extend across the thickness direction. Such a polysilicon thin film can be prepared by forming a doped first amorphous silicon layer containing dispersed crystal phases on a substrate, forming an undoped second amorphous silicon layer on the first amorphous silicon layer, and crystallizing the first and second amorphous silicon layers by heat treatment.

31 Claims, 10 Drawing Sheets

(1) TEXTURED SUBSTRATE
(2) FLAT SUBSTRATE 0.5μm

50Å

POLYSILICON THIN FILM AND METHOD OF PREPARING POLYSILICON THIN FILM AND PHOTOVOLTAIC ELEMENT CONTAINING SAME

BACKGROUND OF THE INVENTION

1. Field of the Invention

The present invention relates to a polysilicon thin film and a method of preparing the same.

2. Description of the Background Art

A polysilicon thin film is employed as a photoelectric conversion layer in a photovoltaic element or the like. It is necessary to improve the photoelectric conversion efficiency in such a photovoltaic element. Thus, it is necessary to increase the sizes of the crystal grains forming the polysilicon thin film for improving the carrier mobility and increasing the carrier diffusion length in the thin film as a means for improving the photoelectric conversion efficiency.

The so-called solid phase growth method of forming an amorphous silicon thin film on a substrate and crystallizing the amorphous silicon thin film by heat treating the same is known as an exemplary method of preparing a polysilicon thin film. Further, the so-called partial doping method is known as a method of preparing a polysilicon thin film having large crystal grain sizes by the solid phase growth method. The partial doping method is adapted to partially dope an amorphous silicon thin film with phosphorus (P) or boron (B) thereby changing the conductivity type or charge carrier type of the amorphous silicon film and selectively starting crystallization from the doped part. According to the partial doping method, crystallization is started from a specific part of the amorphous silicon thin film, whereby it is possible to control the generation of crystal nuclei for obtaining a polysilicon thin film having relatively large crystal grain sizes.

However, such a polysilicon thin film obtained by the conventional partial doping method is limited as to further improvement of the photoelectric conversion efficiency of a photovoltaic element.

SUMMARY OF THE INVENTION

An object of the present invention is to provide a polysilicon thin film having an improved carrier mobility, and a method of preparing the same.

An article according to the present invention comprises a substrate, and a polysilicon thin film on the substrate. The polysilicon thin film is obtained by crystallizing an amorphous silicon thin film that has been formed on the substrate through heat treatment. The polysilicon thin film has substantially no grain boundaries in the direction of its thickness. That is to say, substantially all of the grain boundaries extend substantially in the direction of the thickness, or across the thickness of the film from one surface of the film to the opposite surface of the film.

A photovoltaic element according to the present invention comprises a substrate, a polysilicon thin film obtained in the manner described in the preceding paragraph, and a semiconductor layer forming a semiconductor junction with the polysilicon thin film.

A method according to the present invention can be used for preparing the aforementioned polysilicon thin film, and comprises the steps of forming on a substrate a doped first amorphous silicon layer containing dispersed crystal phases, forming an undoped second amorphous silicon layer on the first amorphous silicon layer, and heat treating the first and second amorphous silicon layers for crystallizing the same.

In the method according to the present invention, the first and second amorphous silicon layers are preferably formed by CVD. The first and second amorphous silicon layers can be formed under the same conditions except for the compositions of the raw material gases, whereby it is possible to form the second amorphous silicon layer subsequently to forming the first amorphous silicon layer by simply changing the raw material gases.

The inventors have discovered that it is possible to improve the carrier mobility of a polysilicon thin film by substantially eliminating grain boundaries in the direction of the film thickness, i.e. grain boundaries that run substantially parallel to the plane of the film. The inventive polysilicon film has a high carrier mobility since it has substantially no grain boundaries in the direction of its thickness. Thus, it is possible to attain a high photoelectric conversion efficiency when the inventive polysilicon thin film is used for a photoelectric conversion layer of a photovoltaic element.

According to the inventive method, which is capable of preparing the aforementioned polysilicon thin film with substantially no grain boundaries in the direction of its thickness, an undoped second amorphous silicon layer is formed on a doped first amorphous silicon layer containing dispersed crystal phases, and the first and second amorphous silicon layers are heat treated to be crystallized. In the crystallization step, crystallization starts from the crystal phases contained in the first amorphous silicon layer, which serve as seeds. Since large crystal grains are grown along the thickness direction, grain boundaries are formed only along the thickness direction of the thin film, so that no grain boundaries are present across the direction of the thickness of the polysilicon thin film as formed. Due to the absence of grain boundaries in the direction of the thickness, i.e. crossing the thickness direction, the carrier mobility is improved along the thickness and therefore the carrier diffusion length increases. At the film surface perpendicular to the thickness direction, the carrier mobility is increased as compared with a conventional polysilicon thin film because it has larger crystal grain sizes than the conventional film. In this film surface, however, the carrier mobility is not as greatly increased as in the direction of the thickness due to the presence of grain boundaries.

When the first and second amorphous silicon layers are formed by CVD as described above, it is possible to form the second amorphous silicon layer subsequent to forming the first amorphous silicon layer by simply changing the raw material gases. Thus, it is possible to form the amorphous silicon layers through continuous steps, thereby remarkably reducing the concentration of impurities such as oxygen, nitrogen, and carbon which are introduced into the interface between the first and second amorphous silicon layers. Thus, crystals are smoothly grown from the crystal phases serving as seeds in the crystallization step so that it is possible to prevent generation of new nuclei. Thereby it is possible to prepare a polysilicon thin film having larger crystal grain sizes with substantially no grain boundaries present in the direction of its thickness, If a number of new nuclei are generated, crystal growth will also start from these new nuclei. Crystal grains would then grow from adjacent nuclei until they come in contact with each other, and no further growth would then be attained. Thus, large crystal grain sizes cannot be attained if a number of new nuclei are generated.

The inventive polysilicon thin film has substantially no grain boundaries in the direction of its thickness, and hence exhibits a high carrier mobility. Thus, it is possible to remarkably improve the photoelectric conversion characteristics by using the inventive polysilicon thin film for a photoelectric conversion layer of a photovoltaic element.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
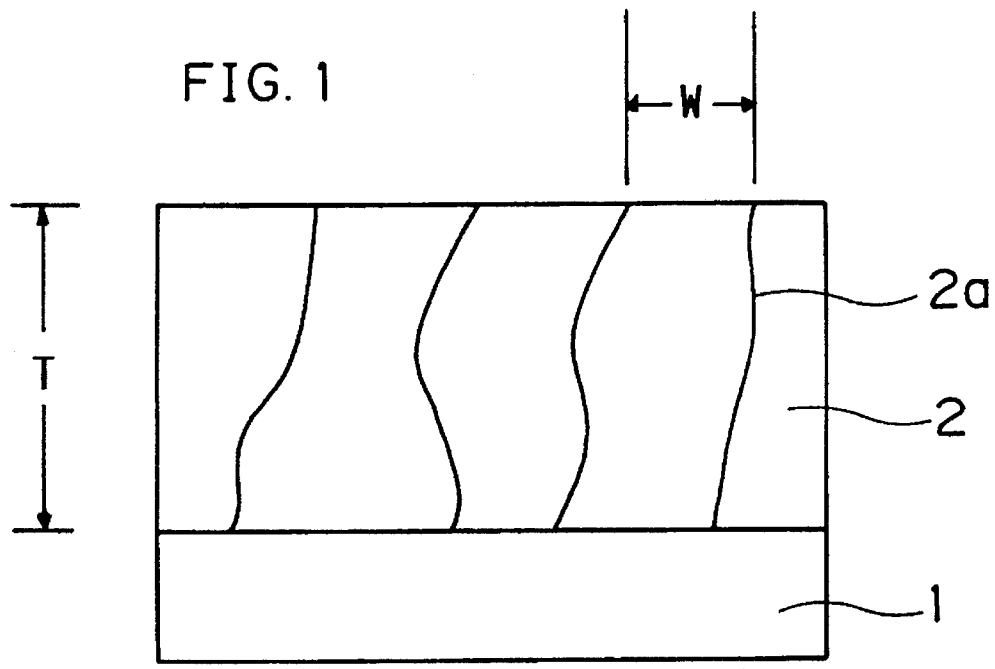
FIG. 1 is a schematic diagram showing a typical crystal structure of a polysilicon thin film according to the present invention.

FIG. 1 is a schematic diagram showing the typical crystal structure of a polysilicon thin film 2 according to the present invention. Referring to FIG. 1, the polysilicon thin film 2 is formed on a substrate 1 so that grain boundaries 2a extend along its thickness direction and no grain boundaries are present in the thickness direction, i.e. crossing the thickness direction. In such a polysilicon thin film, the in-plane sizes W of crystal grains are about 0.1 to 1 relative to the film thickness in general. While the thickness T of such a polysilicon thin film is determined by that of an amorphous silicon thin film which is not yet crystallized, it is possible to prepare the polysilicon thin film 2 with no grain boundaries in the thickness direction as shown in FIG. 1 even if the overall thickness is 20 μm, for example for film thickness of at least 3 μm, or between about 5 μm and 20 μm.

Figure 11:
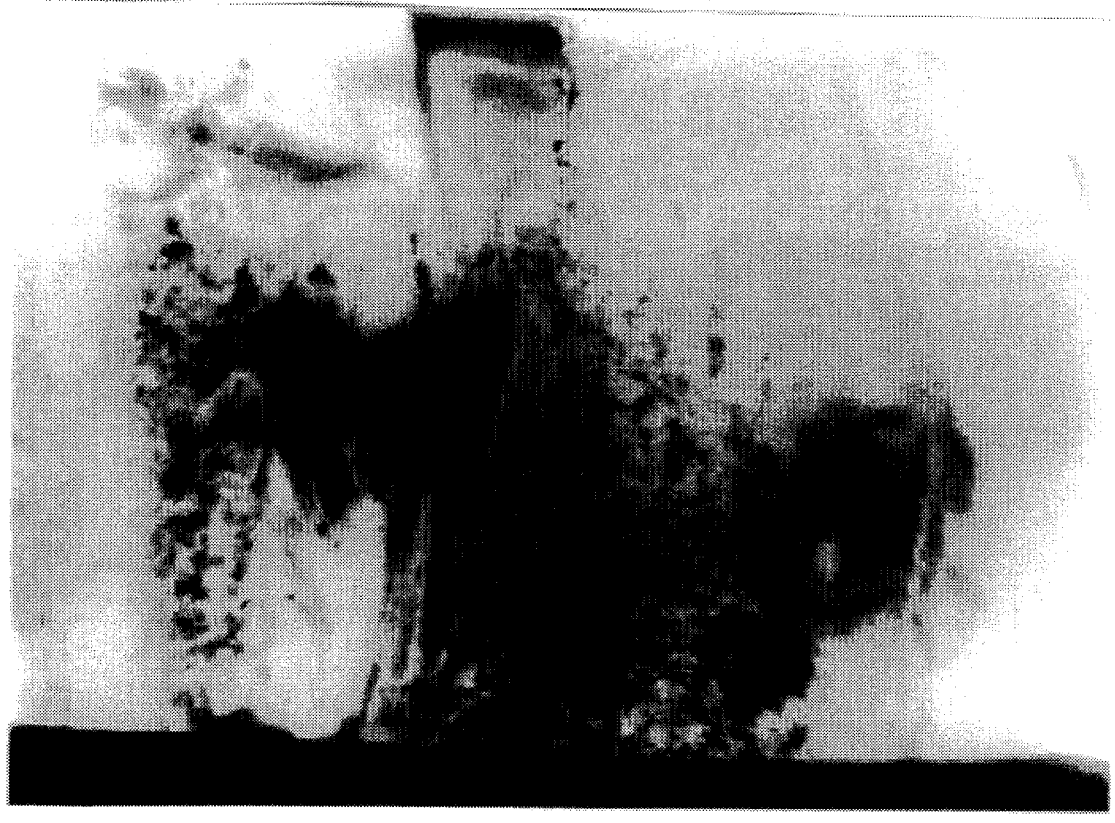
FIG. 11 is a transmission electron microscopy image showing the crystal structure of a polysilicon thin film according to the present invention.
Figure 12:
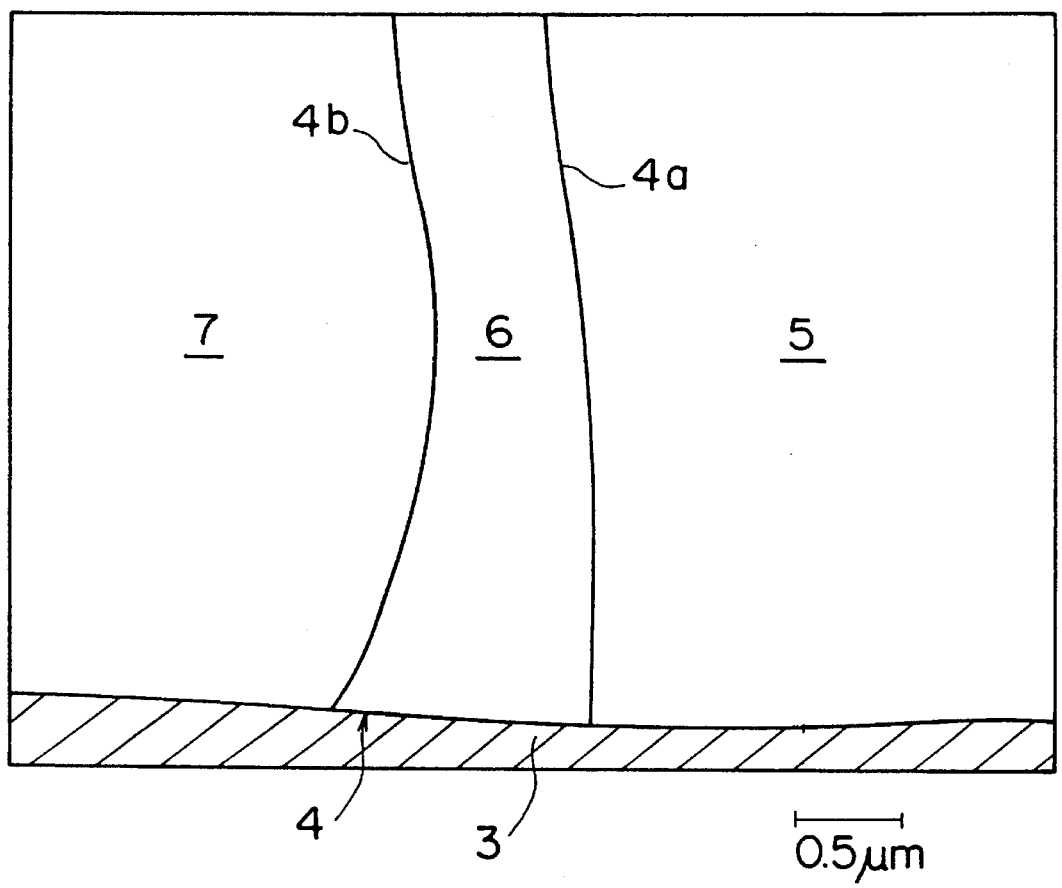
FIG. 12 is a schematic diagram of the transmission electron microscopy image shown in FIG. 11.

FIG. 11 is an electron photomicrograph showing a polysilicon thin film according to the present invention, and FIG. 12 is a schematic drawing typically illustrating the electron photomicrograph shown in FIG. 11. Referring to FIGS. 11 and 12, a polysilicon thin film 4 is formed on a substrate 3, and three crystal grains 5, 6, and 7 consisting of single crystal phases are observed therein. The crystal grain 6 appears rather dark as compared with the crystal grains 5 and 7, since the former has a crystal orientation which is different from those of the latter. It is possible to observe the respective crystal grains by such contrast, and grain boundaries 4a and 4b respectively between the crystal grains 5 and 6 and between the crystal grains 6 and 7 are observed in FIGS. 11 and 12. As clearly understood from FIGS. 11 and 12, the crystal grains 5, 6, and 7 are grown along the thickness direction of the polysilicon thin film 4, whereby the grain boundaries 4a and 4b extend along the thickness direction.

Figure 2:
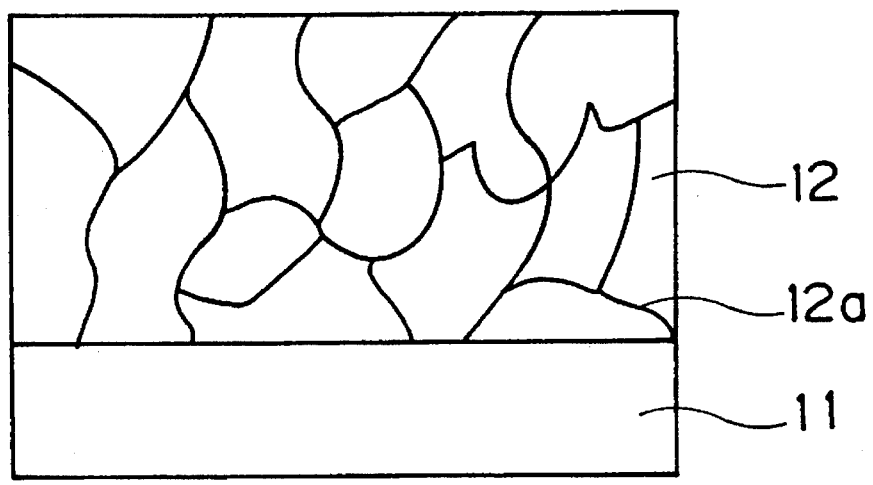
FIG. 2 is a schematic diagram showing a typical crystal structure of a polysilicon thin film obtained by a conventional partial doping method.

FIG. 2 is a schematic diagram showing the typical crystal structure of a polysilicon thin film obtained by a conventional partial doping method. Referring to FIG. 2, a polysilicon thin film 12 is formed on a substrate 11, and a grain boundary 12a is present in the thickness direction of this polysilicon thin film 12 i.e. the grain boundary 12a extends substantially across the thickness direction.

An embodiment of a method of preparing the polysilicon thin film shown in FIG. 1 is now described.

Figure 3:
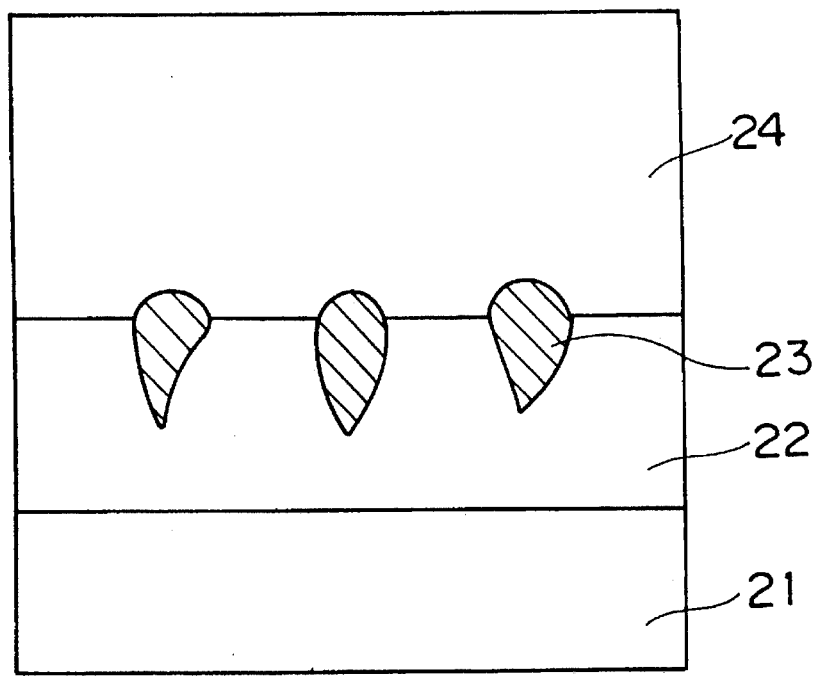
FIG. 3 is a sectional view showing typical first and second amorphous silicon layers formed by a method according to an embodiment of the present invention.

FIG. 3 is a sectional view showing first and second amorphous silicon layers which are formed in the embodiment of the method according to the present invention. Referring to FIG. 3, a doped first amorphous silicon layer 22 containing dispersed crystal phases 23 is formed on a substrate 21. According to this embodiment, the first amorphous silicon layer 2 is doped with P. Further, the first amorphous silicon layer 22 is formed in a thickness of about 0.2 μm in this embodiment. In practice, the substrate 21 is formed by a light-transmissive quartz substrate.

The first amorphous silicon layer 22 can be formed by plasma CVD, and the conditions for forming this layer can be set within the following ranges: substrate temperature of 500° to 600° C., gas flow rates of 3 to 5 sccm for $SiH_4$, 0.003 to 0.01 sccm for $PH_3$, and 40 to 300 sccm for $H_2$, reaction pressure of 10 to 100 Pa, and RF power of 50 to 100 $mW/cm^2$, for example. Under such conditions, it is possible to form the first amorphous silicon layer 22 containing dispersed crystal phases 23 as shown in FIG. 3.

Figure 13:
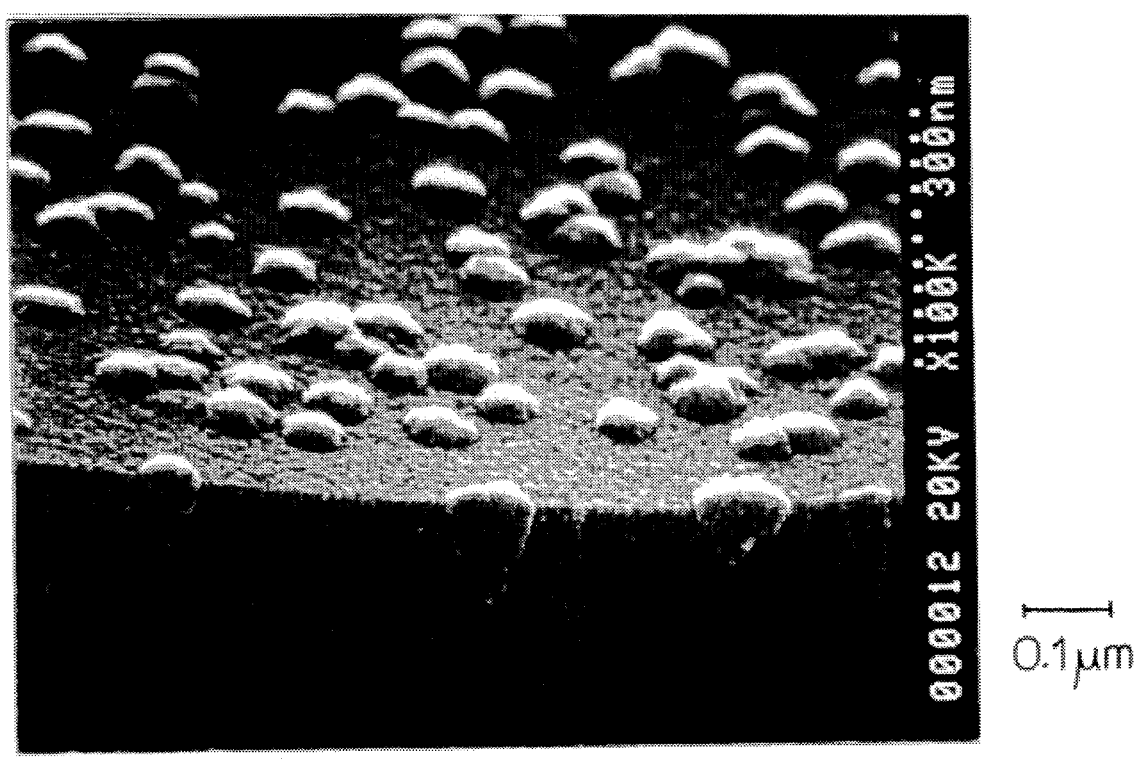
FIG. 13 is a scanning electron microscopy image showing a first amorphous silicon layer formed according to the embodiment of the present invention.

FIG. 13 is a scanning electron microscopy image showing a first amorphous silicon layer formed in the aforementioned manner. As shown in FIG. 13, crystal phases are dispersed in the amorphous silicon layer. Lower portions of these crystal phases are buried in the amorphous silicon layer, as understood from the sectional portion of the amorphous silicon layer shown at the front, i.e. bottom of FIG. 13.

Figure 14:
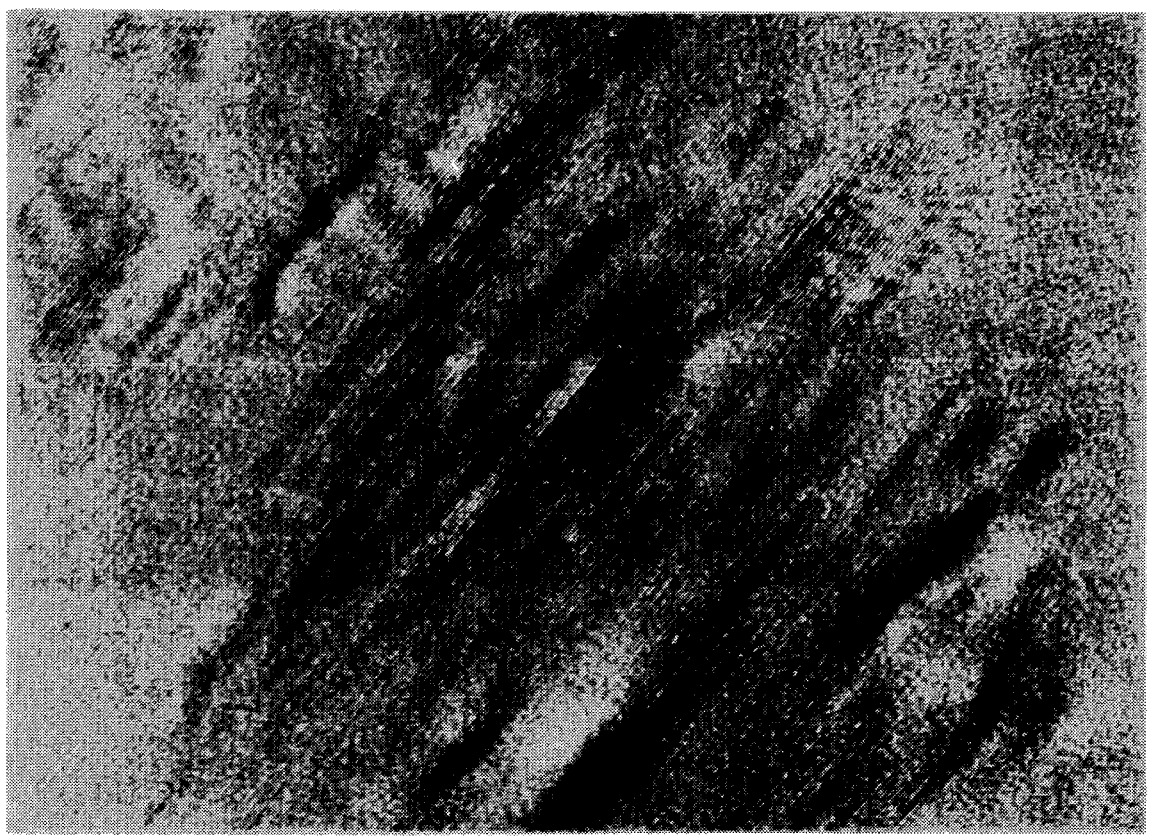
FIG. 14 is a lattice image of transmission electron microscopy showing the first amorphous silicon layer formed according to the embodiment of the present invention.
Figure 15:
FIG. 15 is a transmitted electron diffraction pattern obtained by irradiating crystal phases of the first amorphous silicon layer formed according to an Example of the present invention with an electron beam.

FIG. 14 is a lattice image of transmission electron microscopy showing the first amorphous silicon layer from above. A portion containing the crystal phases is observed in this figure. FIG. 15 illustrates a diffraction pattern obtained by irradiating the portion containing the crystal phases with an electron beam. As shown in FIG. 15, it is confirmed that the crystal phases are a single-crystalline phase from observation of the diffraction pattern.

The crystal phases 23 are preferably 100 Å to 10 µm in size, and about 1000 to 2000 Å in size according to this embodiment. Further, according to this embodiment, upper portions of the crystal phases 23 upwardly project from the surface of the first amorphous silicon layer 22 by about 200 to 600 Å. According to the present invention, the crystal phases 23 may not necessarily project as shown in FIG. 3, but may alternatively be buried in the first amorphous silicon layer 22.

It is possible to adjust the degree of dispersion of the crystal phases 23 by adjusting any one of the conditions for forming the first amorphous silicon layer 22, such as the RF power, for example, or by forming a textured surface on the substrate 21 and adjusting the texture spaces. The spaces between the crystal phases 23 are preferably about 0.5 to 20 µm.

Referring again especially to FIG. 3, an undoped second amorphous silicon layer 24 is formed on the first amorphous silicon layer 22 which has been formed in the aforementioned manner. According to this embodiment, the second amorphous silicon layer 24 is formed by plasma CVD, and conditions for forming this layer can be set within the following ranges substrate temperature of 500° to 600° C., gas flow rate of 10 to 60 sccm for $SiH_4$ or 10 to 40 sccm for $Si_2H_6$, reaction pressure of 10 to 100 Pa, and RF power of 100 to 500 $mW/cm^2$, for example. Since these conditions can be identical to those for the first amorphous silicon layer 22 except the reaction gas conditions, it is possible to form the second amorphous silicon layer 24 under the conditions for the first amorphous silicon layer 22 by changing only the reaction gases. In practice, the second amorphous silicon layer 24 is formed in a thickness of about 3 µm.

Figure 4:
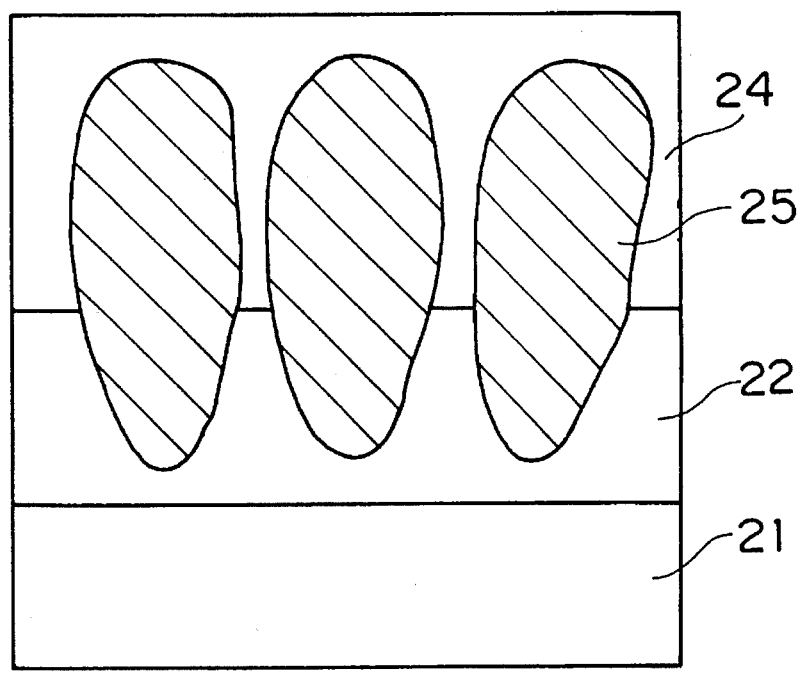
FIG. 4 is a sectional view showing the first and second amorphous silicon layers, of FIG. 3, after they have been crystallized by heat treatment.

Then, the first and second amorphous silicon layers 22 and 24 formed in the aforementioned manner are heat treated to be crystallized. Preferable heat treatment conditions are about 550° to 650° C. and about 3 to 20 hours. In practice, the first and second amorphous silicon layers 22 and 24 are heat treated at 600° C. for 10 hours to be crystallized. The heat treatment is preferably carried out in a vacuum or in a nitrogen atmosphere. In such a crystallization step, the crystal phases 23 shown in FIG. 3 serve as seeds for starting crystallization. FIG. 4 is a sectional view showing a typical intermediate state of such crystallization. It is understood from FIG. 4 that crystallization progresses along the thickness direction, to form crystal grains 25. The crystal grains 25 as grown extend over the entire regions of the first and second amorphous silicon layers 22 and 24, to form the polysilicon thin film shown in FIG. 1.

Figure 5:
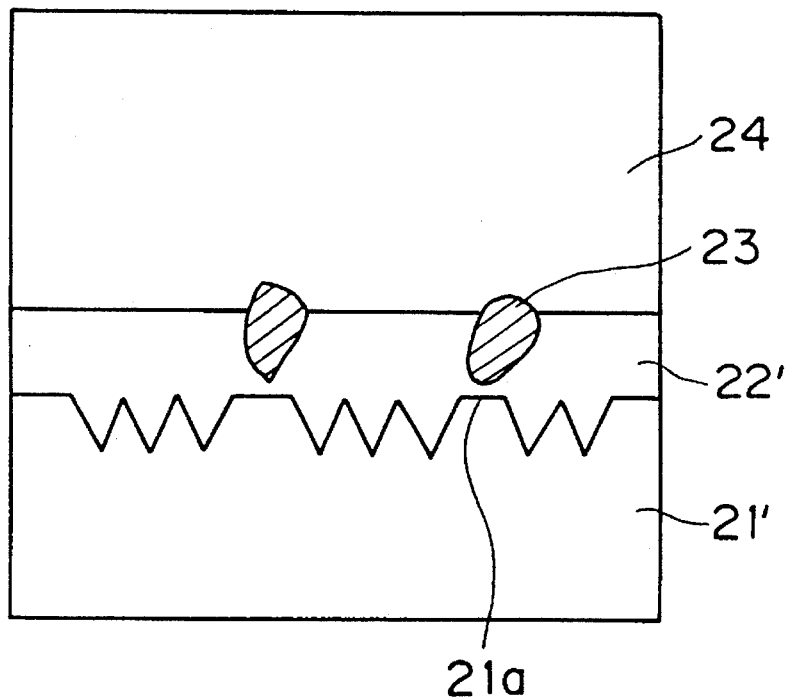
FIG. 5 is a sectional view showing the states of crystal phases on a substrate having a textured surface.
Figure 6:
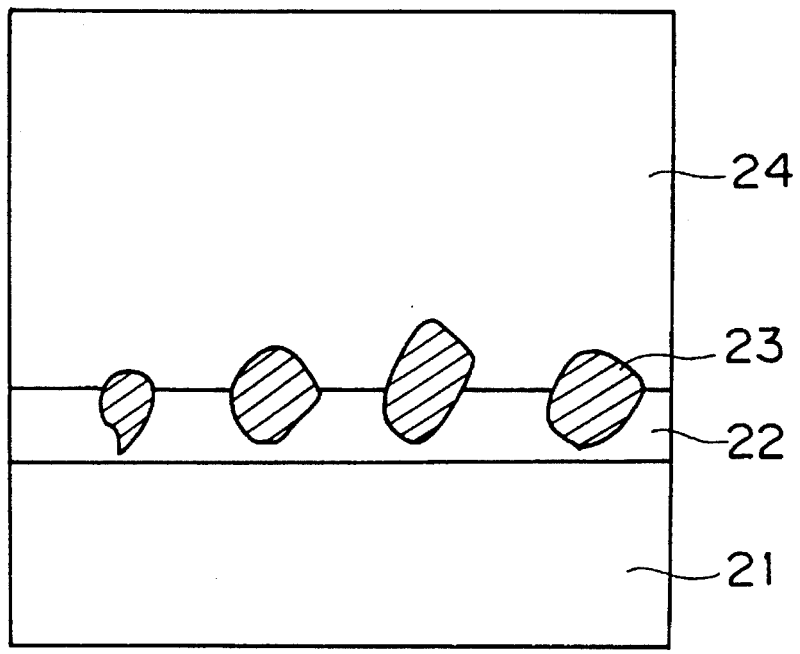
FIG. 6 is a sectional view showing the states of crystal phases on a substrate having a flat surface.

FIGS. 5 and 6 are sectional views for illustrating a method of adjusting the spaces between crystal phases by properly forming the aforementioned textured surface of the substrate. Referring to FIG. 5, a first amorphous silicon layer 22' is formed on a textured substrate 21', and crystal phases 23 are dispersed in the first amorphous silicon layer 22'. As shown in FIG. 5, each crystal phase 23 is formed on a flat portion 21a of the textured surface of the substrate 21'. FIG. 6 is a sectional view showing a flat substrate 21, on which crystal phases 23 are formed in a denser state as compared with those in FIG. 5. Thus, it is possible to adjust the degree of dispersion of crystal phases, i.e., the spaces between the crystal phases, by forming flat portions on a textured substrate in a desired density.

Figure 7:
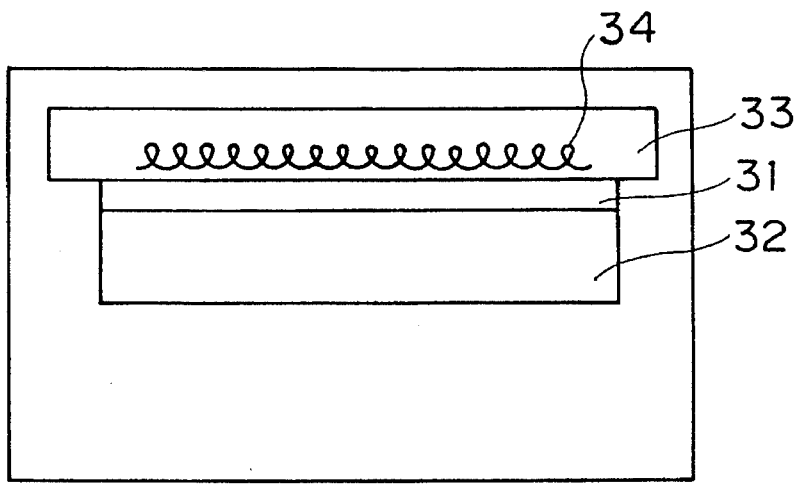
FIG. 7 is a schematic diagram showing an exemplary heat treatment apparatus which can be used in the inventive method.

FIG. 7 is a schematic sectional view showing a typical heat treatment apparatus for carrying out such crystal growth. Referring to FIG. 7, a substrate 31 provided with an amorphous silicon layer 32 is mounted on a stage 33, which is provided with a heater 34. Such an apparatus that can heat the amorphous silicon layer 32 from the substrate 31 side is preferable.

Figure 8:
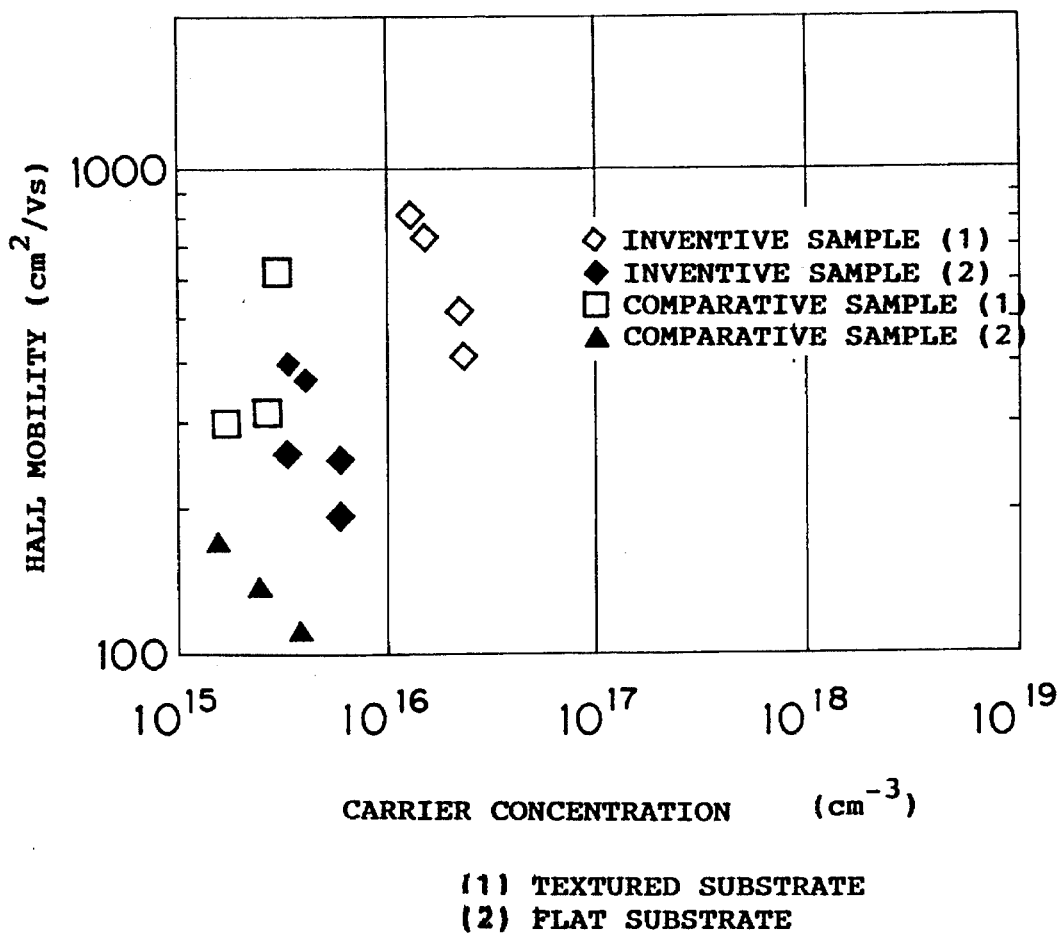
FIG. 8 is a graph showing Hall mobility values of polysilicon thin films prepared according to an Example of the invention and a comparative example.

Samples of polysilicon thin films according to the invention were formed on silica substrates having flat and textured surfaces, respectively, similarly to the aforementioned embodiment. Then, the Hall mobility of the samples was measured. Further, comparative samples of polysilicon thin films were formed on silica substrates having flat and textured surfaces, respectively, by a conventional partial doping method. The Hall mobility of the comparative samples was also measured. FIG. 8 shows the results.

The textured surfaces of the substrates were formed by a blasting method of perpendicularly bombarding the substrates with diamond grains of 10 µm in size. In this manner, the textured substrates were formed with peak-to-valley and peak-to-peak distances of 10 to 20 µm.

In the comparative samples, doped amorphous silicon layers were formed by the conventional partial doping method under conditions of substrate temperatures of 500° to 600° C., gas flow rates of 10 to 20 sccm for $SiH_4$ and 0.001 to 0.01 sccm for $PH_3$, reaction pressures of 10 to 100 Pa, and RF power levels of 100 to 200 $mW/cm^2$. The comparative samples were remarkably different from the inventive samples with respect to diluting the reaction gases with hydrogen gas. Undoped amorphous silicon layers were formed on the doped amorphous silicon layers under conditions similar to those of the aforementioned embodiment.

As understood from FIG. 8, the inventive polysilicon thin films exhibited higher Hall mobility values for a given carrier concentration, as compared with the comparative polysilicon thin films which were formed by the conventional method. It was possible to attain 808 $cm^2/Vs$ (carrier concentration: $1.3 \times 10^{16}$ $cm^{-3}$) as the highest Hall mobility. Inventive Sample (1) with a textured substrate was shown to have a Hall mobility greater than about 400 $cm^2/Vs$ and clearly greater than 300 $cm^2/Vs$, with a carrier concentration greater than $10^{16}/cm^3$. Inventive Sample (2) with a flat substrate was shown to have a Hall mobility generally greater than about 200 $cm^2/Vs$, with a carrier concentration generally greater than about $5 \times 10^{15}/cm^3$.

Figure 9:
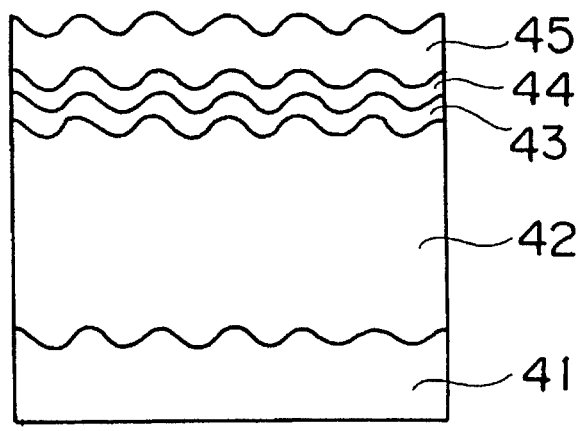
FIG. 9 is a sectional view showing the typical structure of a photovoltaic element prepared according to an Example of the present invention.

Then, a photovoltaic element was prepared with a polysilicon thin film according to the present invention. FIG. 9 shows the structure of this photovoltaic element, comprising an SUS stainless steel substrate 41 having a textured surface, and an n-type polysilicon thin film layer 42 formed thereon to have a thickness of 10 µm. The textured surface of the substrate 41 had peak-to-valley and peak-to-peak distances of 10 to 20 µm. The n-type polysilicon thin film layer 42 was formed by first and second amorphous silicon layers having thicknesses of 1000 Å and 10 µm, respectively.

An i-type amorphous silicon layer 43 of 50 Å in thickness and a p-type amorphous silicon layer 44 of 50 Å in thickness were successively deposited on the n-type polysilicon thin film layer 42, and an ITO film 45 of 700 Å in thickness was further formed thereon as a surface antireflection film and a electrode.

Figure 10:
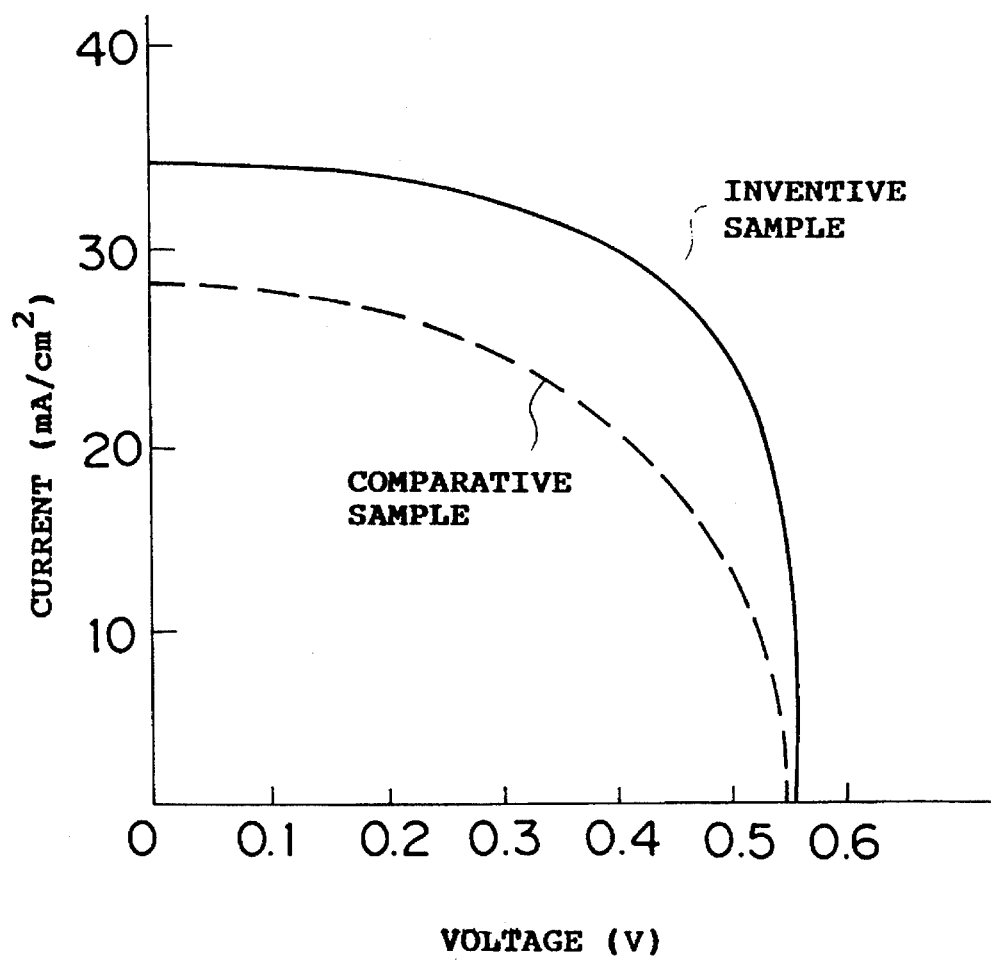
FIG. 10 is a graph showing current-voltage characteristics of the photovoltaic element prepared according to an Example of the present invention.

For the purpose of comparison, another photovoltaic element was prepared with a layer, which corresponds to the n-type polysilicon thin film layer 42 shown in FIG. 9, but which was formed by a conventional partial doping method. FIG. 10 shows current-voltage characteristics of the photovoltaic elements according to the inventive and comparative samples.

As can be seen from FIG. 10, the inventive photovoltaic element employing the polysilicon thin film according to the present invention was extremely improved in short-circuit current and fill factor (F.F.) as compared to the comparative sample. Particularly, the photovoltaic element had a short-circuit current of at least 33 mA/cm$^2$, an open-circuit voltage of at least 0.55 V, and a current of at least 30 mA/cm$^2$ at a voltage of 0.4 V. Thus, it is understood that the inventive polysilicon thin film is very suitable for use in a photovoltaic element.

Although phosphorus is described as a dopant for the first amorphous silicon layer in the aforementioned embodiment, the dopant is not restricted to phosphorus. Alternatively, an n-type dopant may be antimony, and a p-type dopant may be boron or aluminum, for example.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A polysilicon thin film formed on a substrate and obtained by crystallizing through heat treatment, an amorphous silicon thin film formed on said substrate, wherein said polysilicon thin film has a thickness of at least 3 μm, and has crystal grains, wherein substantally all grain boundaries of said crystal grains extend substantially in the direction of said thickness.

2. The polysilicon thin film formed on a substrate in accordance with claim 1, wherein said substrate has a textured surface.

3. The polysilicon thin film formed on a substrate in accordance with claim 2, wherein said textured surface has peak-to-peak and peak-to-valley spacing distances within the range from 10 μm to 20 μm.

4. The polysilicon thin film formed on a substrate in accordance with claim 2, wherein said textured surface comprises relatively flat areas dispersed among relatively textured areas.

5. The polysilicon thin film formed on a substrate in accordance with claim 2, having a Hall mobility greater than 400 cm$^2$/Vs and a carrier concentration greater than $10^{16}$/cm$^3$.

6. The polysilicon thin film formed on a substrate in accordance with claim 1, wherein substantially all said grain boundaries extend across said thickness of said film from a first surface of said film to a second surface of said film opposite said first surface.

7. The polysilicon thin film formed on a substrate in accordance with claim 1, wherein said thickness is between about 5 μm and 20 μm.

8. The polysilicon thin film formed on a substrate in accordance with claim 1, wherein said substrate has a flat surface, and said thin film has a Hall mobility greater than 200 cm$^2$/Vs and a carrier concentration greater than $5 \times 10^{15}$/cm$^3$.

9. The polysilicon thin film formed on a substrate in accordance with claim 1, wherein said crystal grains have an inplane crystal width in the plane of said thin film of about 0.1 to about 1 times said thickness.

10. A photovoltaic element comprising: a substrate; a polysilicon thin film obtained by forming an amorphous silicon thin film on said substrate and crystallizing said amorphous film through heat treatment, wherein said polysilicon thin film has a thickness of at least 3 μm, and has crystal grains with an inplane crystal width in the plane of said thin film of about 0.1 to about 1 times said thickness, and wherein substantially all grain boundaries of said crystal grains extend substantially in the direction of said thickness; and a semiconductor layer forming a semiconductor junction with said polysilicon thin film.

11. The photovoltaic element in accordance with claim 10, wherein said semiconductor layer is an amorphous silicon layer.

12. The photovoltaic element in accordance with claim 11, wherein said amorphous silicon layer comprises a silicon thin film of opposite conductivity type relative to said polysilicon thin film.

13. The photovoltaic element in accordance with claim 11, wherein said amorphous silicon layer comprises an intrinsic first silicon thin film, and a second silicon thin film of opposite conductivity type relative to said polysilicon thin film.

14. The photovoltaic element in accordance with claim 10, wherein said substrate has a textured surface.

15. The photovoltaic element in accordance with claim 10, having a short-circuit current of at least 33 mA/cm$^2$, an open-circuit voltage of at least 0.55 V, and a current of at least 30 mA/cm$^2$ at a voltage of 0.4 V.

16. A method of preparing a polysilicon thin film, comprising the steps of:

forming on a substrate a doped first amorphous silicon layer containing dispersed crystal phases;

forming an undoped second amorphous silicon layer on said first amorphous silicon layer; and heat treating said first and second amorphous silicon layers for crystallizing the same.

17. The method of preparing a polysilicon thin film in accordance with claim 16, wherein said steps of forming said first and second amorphous silicon layers comprise forming said amorphous silicon layers by CVD.

18. The method of preparing a polysilicon thin film in accordance with claim 17, wherein said steps of forming said first and second amorphous silicon layers are sequentially carried out by changing raw material gases.

19. The method of preparing a polysilicon thin film in accordance with claim 17, wherein said first layer is formed under conditions of a substrate temperature of 500° to 600° C., and SiH$_4$ gas flow rate of 3 to 5 sccm, a PH$_3$ gas flow rate of 0.003 to 0.01 sccm, an H$_2$ gas flow rate of 40 to 300 sccm, a reaction pressure of 10 to 100 Pa, and an RF power of 50 to 100 mW/cm$^2$, and wherein said second layer is formed under conditions of a substrate temperature of 500° to 600° C., at least one of an SiH$_4$ gas flow rate of 10 to 60 sccm and an Si$_2$H$_6$ gas flow rate of 10 to 40 sccm, a reaction pressure of 10 to 100 Pa, and an RF power of 100 to 500 mW/cm$^2$.

20. The method of preparing a polysilicon thin film in accordance with claim 16, wherein said substrate has a textured surface.

21. The method of preparing a polysilicon thin film in accordance with claim 20, further comprising adjusting the degree of dispersion of said crystal phases in said first amorphous silicon layer by adjusting the texturing of said substrate.

22. A photovoltaic element comprising as a photoactive layer a polysilicon thin film obtained by a method in accordance with claim 16.

23. The photovoltaic element of claim 22, wherein said polysilicon thin film has a thickness of at least 3 μm.

24. The photovoltaic element of claim 22, wherein said polysilicon thin film has a Hall mobility of at least 300 cm$^2$/Vs and a carrier concentration of at least $10^{16}$/cm$^3$.

25. The method of preparing a polysilicon thin film in accordance with claim 16, wherein said heat treating is carried out within the temperature range from 550° C. to 650° C. for a time within the range from 3 hours to 20 hours.

26. The method of preparing a polysilicon thin film in accordance with claim 16, wherein said heat treating is carried out at a temperature of about 600° C. for a time of about 10 hours.

27. The method of preparing a polysilicon thin film in accordance with claim 16, wherein said crystal phases are dispersed with a spacing of about 0.5 to about 20 µm.

28. The method of preparing a polysilicon thin film in accordance with claim 16, wherein said crystal phases have sizes in the range of 100 Å to 10 µm.

29. The method of preparing a polysilicon thin film in accordance with claim 16, wherein said crystal phases have sizes in the range of 1000 Å to 2000 Å.

30. The method of preparing a polysilicon thin film in accordance with claim 16, wherein said crystal phases protrude from said first layer by about 200 Å to about 600 Å into said second layer.

31. The method of preparing a polysilicon thin film in accordance with claim 16, wherein said first layer is formed to have a thickness in the range from about 0.1 µm to about 0.2 µm, and said second layer is formed to have a thickness in the range from about 3 µm to about 10 µm.

* * * * *

UNITED STATES PATENT AND TRADEMARK OFFICE
CERTIFICATE OF CORRECTION

PATENT NO.   :   5,486,237
DATED        :   Jan. 23, 1996
INVENTOR(S)  :   Sano et al.

It is certified that error appears in the above-identified patent and that said Letters Patent is hereby corrected as shown below:

Col. 1, line  6, delete "BACKGROUND OF THE INVENTION".

Col. 4, line  3, after "thickness" (first occurrence) insert --T--.

Col. 5, line 27, after "ranges" insert --:--.

Col. 6, line 61, replace "a" (second occurrence) by --an--.

Col. 8, line 44, (Claim 19), replace "and" by --an--.

Signed and Sealed this

Seventh Day of May, 1996

Attest:

BRUCE LEHMAN

*Attesting Officer*          *Commissioner of Patents and Trademarks*